US008084190B2

United States Patent
Gutsche et al.

(10) Patent No.: US 8,084,190 B2
(45) Date of Patent: Dec. 27, 2011

(54) PROCESS FOR PRODUCING SUBLITHOGRAPHIC STRUCTURES

(75) Inventors: Martin Gutsche, Dorfen (DE); Harald Seidl, Pöring (DE)

(73) Assignee: Infineon Technologies AG, Neubiberg (DE)

( * ) Notice: Subject to any disclaimer, the term of this patent is extended or adjusted under 35 U.S.C. 154(b) by 138 days.

(21) Appl. No.: 12/548,723

(22) Filed: Aug. 27, 2009

(65) Prior Publication Data

US 2010/0006983 A1 Jan. 14, 2010

Related U.S. Application Data

(62) Division of application No. 11/361,849, filed on Feb. 23, 2006, now Pat. No. 7,605,090.

(30) Foreign Application Priority Data

Feb. 24, 2005 (DE) .......................... 10 2005 008 478

(51) Int. Cl.
*H01L 21/027* (2006.01)
*H01L 21/033* (2006.01)
*C23F 1/02* (2006.01)

(52) U.S. Cl. ............. 430/311; 438/719; 216/41; 216/67

(58) Field of Classification Search .................. None
See application file for complete search history.

(56) References Cited

U.S. PATENT DOCUMENTS

| 4,354,896 | A | * | 10/1982 | Hunter et al. | 438/696 |
| 4,631,113 | A | * | 12/1986 | Donald | 438/301 |
| 5,328,810 | A | * | 7/1994 | Lowrey et al. | 430/313 |
| 5,714,039 | A | * | 2/1998 | Beilstein et al. | 438/694 |
| 7,186,649 | B2 | * | 3/2007 | Shim et al. | 438/689 |
| 7,585,614 | B2 | * | 9/2009 | Furukawa et al. | 430/311 |
| 2002/0063110 | A1 | * | 5/2002 | Cantell et al. | 216/51 |

FOREIGN PATENT DOCUMENTS

DE 44 46 852 A1 * 12/1994

OTHER PUBLICATIONS

S. Borel et. al. Microelectronic Engineering 73-74, 301 (2004).*

* cited by examiner

*Primary Examiner* — Benjamin Sandvik
*Assistant Examiner* — Joseph Schoenholtz

(57) ABSTRACT

A layer structure and process for providing sublithographic structures are provided. A first auxiliary layer is formed over a surface of a carrier layer. A lithographically patterned second auxiliary layer structure is formed on a surface of the first auxiliary layer. The first auxiliary layer is anisotropically etched using the patterned second auxiliary layer structure as mask to form an anisotropically patterned first auxiliary layer structure. The anisotropically patterned first auxiliary layer structure is isotropically etched back using the patterned second auxiliary layer structure to remove subsections below the second auxiliary layer structure and to form an isotropically patterned first auxiliary layer structure. A mask layer is formed over the carrier layer including the subsections beneath the second auxiliary layer structure and is anisotropically etched down to the carrier layer to form the sublithographic structures. The first and second auxiliary layer structures are removed to uncover the sublithographic structures.

13 Claims, 2 Drawing Sheets

PROCESS FOR PRODUCING SUBLITHOGRAPHIC STRUCTURES

CROSS REFERENCE TO RELATED APPLICATIONS

This application is a divisional application of U.S. Ser. No. 11/361,849 filed Feb. 23, 2006 now U.S. Pat. No. 7,605,090, which claims priority to German Patent Application DE 10 2005 008 478.8, filed on Feb. 24, 2005, both of which are incorporated by reference in their entirety.

TECHNICAL FIELD

The present invention relates to a process for producing sublithographic structures, and in particular sublithographic structures which are at a sublithographic distance from one another.

BACKGROUND OF THE INVENTION

The development of suitable lithography processes for producing very fine structures, for example of a size of less than 100 nm, is presenting extraordinarily difficult problems. Some of these problems result from the resist chemistry, the mask production and the complexity of the lithography system.

Optical lithography for producing very fine structures in a range of less than 100 nm has reached 157 nm lithography processes. These lithography processes require new types of resist materials. However, despite the most intensive efforts, a resist which completely satisfies the technical demands with regard to such small structures has not yet been found. Furthermore, in addition to these new materials, new processes for mask production are also required. The development of these processes is once again very cost-intensive. Therefore, very cost-intensive lithography systems that are difficult to handle are the result.

Consequently, sublithographic processes have been introduced as an alternative to conventional optical lithography processes of the above type. In these sublithographic processes, a structure is formed photolithographically on an auxiliary layer, for example using a conventional photoresist, the auxiliary layer is anisotropically etched using the patterned photoresist, the resist mask is removed, and then the auxiliary layer is etched back again from all sides by means of an isotropic etching process and is thereby reduced in size. This gives sublithographic mask structures which can be transferred to a gate layer using standard etching processes to form, for example, sublithographic gate structures.

In the same way, sublithographic mask structures of this type can also be formed by means of a spacer process. In a spacer process, a first mask with substantially vertical side walls is formed and patterned, usually by means of optical lithography. Then, a very thin second mask layer is deposited over the entire surface of the first mask up to a predetermined thickness. Next, the horizontal layer regions of the second mask layer are removed by means of an anisotropic etching process, so that only a sublithographic mask structure remains on the side wall of the first mask. Finally, the first mask is removed and the isolated sublithographic mask structures with their predetermined thickness or gate length are transferred into the gate layer below to form, for example, a sublithographic gate structure.

However, a drawback of conventional processes of this type is that although it is in this way possible to produce sublithographic structures, the minimum distance between these structures continues to be determined by the lithographic system. The minimum distance is greater than the minimum feature size F that can be produced by means of lithography. More specifically, conventional processes of this nature continue to have a pitch, which is composed of the sum of a structure width and a distance between directly adjacent structures, which is still 2 F, i.e. double the minimum feature size that can be produced by means of lithography.

Therefore, to provide sublithographic structures in which a distance between adjacent structures also has sublithographic dimensions, as well as a process for producing the sublithographic structures.

BRIEF DESCRIPTION OF THE DRAWINGS

The present invention is illustrated by way of example and not limited to the accompanying figures in which like references indicate similar elements. Exemplary embodiments will be explained in the following text with reference to the attached drawings, in which.

Skilled artisans appreciate that elements in the figures are illustrated for simplicity and clarity and have not necessarily been drawn to scale

DETAILED DESCRIPTION OF THE INVENTION

A sublithographic structure and process for forming such a structure are provided. The process includes forming a first auxiliary layer over a carrier layer and lithographically patterning a second auxiliary layer structure on the first auxiliary layer. The first auxiliary layer is anisotropically etched back using the second auxiliary layer structure as mask and then isotropic etchback removes subsections below the first auxiliary layer structure. A mask layer is formed at the subsections and an anisotropic etchback of the mask layer is carried out to form the sublithographic structure. Following the removal of the first and second auxiliary layer structures, the sublithographic structure is uncovered, and not only a width but also a distance between adjacent structures has a sublithographic dimension. A symmetric structure may be formed in which a width of the sublithographic structures is equal to the distance between two adjacent sublithographic structures. If a minimum feature size F that can be produced by means of lithography is used as the structure width of the lithographically patterned auxiliary layer structure, accordingly a width of 0.5 F results both for the distance and for the sublithographic structure, with the result that the pitch (feature size+distance) has a value of F.

Figure 1:
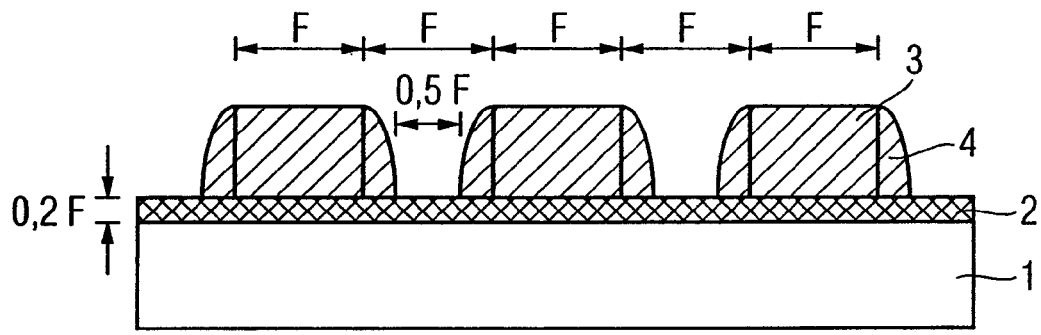
FIGS. 1-6 show simplified sectional views illustrating process steps in the production of sublithographic structures in accordance with a first and second exemplary embodiment.

In accordance with FIG. 1, a carrier layer 1 is provided. This may be a carrier substrate, such as for example a semiconductor wafer, or may be a carrier layer 1 formed on a carrier substrate (not shown). In one embodiment, a Si layer 1 is deposited on a silicon semiconductor wafer to act as the carrier layer that is to be patterned. Then, a SiGe layer is formed as first auxiliary layer 2 with a thickness of less than 0.5 F, where F represents a minimum feature size which can be produced by means of lithography on the production line. The layer thickness of the first auxiliary layer 2 in one embodiment is less than 0.25 F or even less than 0.2 F, with the result that a sufficient absence of voids can be ensured for subsequent deposition.

Alternatively, the first auxiliary layer 2 used may also be a carbon layer, SiLK or other materials with a suitable etching selectivity. In this context, SiLK is an organic spin-on polymer with ideal filling properties and good planarization properties which is thermally stable up to 450 degrees Celsius. SiLK is marketed by Dow Chemical.

A CVD process may be carried out for depositing the first auxiliary layer 2. Using this CVD process, the first auxiliary layer 2 is formed with a substantially uniform layer thickness, i.e. is formed conformally on the surface of the planar carrier layer 1. In principle, however, it is also conceivable to use sputtering (PVD, physical vapor deposition) processes or other processes by means of which a layer of this type with an accurately adjustable layer thickness can be formed.

Then, lithographically patterned second auxiliary layer structures are formed on the surface of the first auxiliary layer 2. The dimensions of these second auxiliary layer structures are determined substantially by photolithographic processes. A second auxiliary layer is deposited over the entire surface of the first auxiliary layer 2, for example by means of a CVD process. The material used may be, for example, SiN or $Si_3N_4$. Then, lithographic patterning of the second auxiliary layer is carried out to form a lithographic auxiliary layer structure 3. More specifically, lithography and etching of the second auxiliary layer are carried out as far as the first auxiliary layer 2, so that lines and distances between them with a pitch of 2 F are established, where F once again represents the minimum feature size that can be produced by means of lithography.

Following the formation of the lithographic auxiliary layer structure 3 with a structure width F and a distance between the structures of F, a spacer structure 4 is then formed on the side walls of the lithographic auxiliary layer structure 3 to complete the second auxiliary layer structure. More specifically, a spacer layer of uniform thickness is formed over the entire surface of the lithographic auxiliary layer structure 3 and the first auxiliary layer 2 and is then etched back by means of a spacer process, i.e. anisotropically, to form the spacer structure 4 illustrated in FIG. 1. Formation of the spacer structure allows the dimensions of the second auxiliary layer structure to be set very accurately.

The same material for the spacer layer or the spacer structure 4 may be used for the lithographic auxiliary layer structure 3, with SiN being used in the present embodiment. The thickness of the spacer layer substantially determines a distance between two adjacent sides of the auxiliary layer structures, and to realize a symmetric sublithographic structure in which a structure width is equal to a distance between two structures, about ¼ of the width of the lithographical auxiliary layer structure 3. Thus, to realize minimum structure widths with minimum distances, the thickness of the spacer layer is set to F/4.

Figure 2:
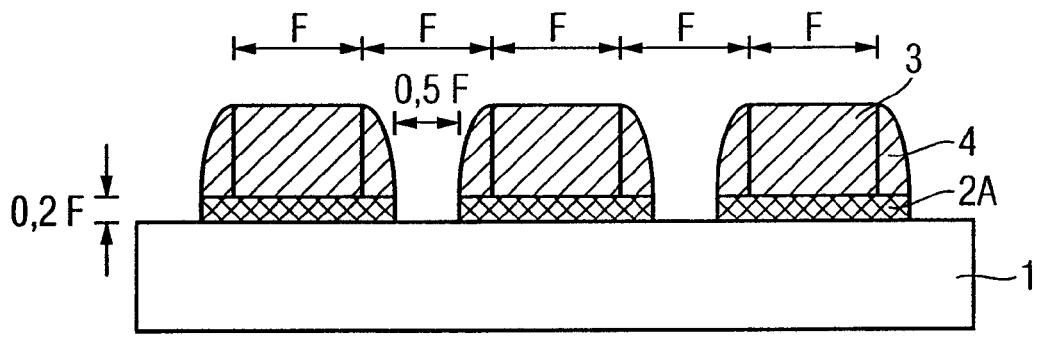

Then, in accordance with FIG. 2, an anisotropic etchback of the first auxiliary layer 2 is carried out, using the patterned second auxiliary layer structure as a mask, as far as the carrier layer 1. The result is anisotropically patterned first auxiliary layer structure 2A, which is of substantially the same width as the second auxiliary layer structure 3 and 4. In this case, an RIE dry etching process may be used. For example, an RIE dry etching process for SiGe and C. SiGe can in this case be etched using fluorine, chlorine or bromine chemistry. If a $CF_4$ plasma is used, SiGe can be etched, for example, with a plasma energy of 700 W and a pressure of approx. 46 Pa (350 mT). By way of example, $O_2$ plasma is used for carbon as first auxiliary layer 2.

Figure 3:
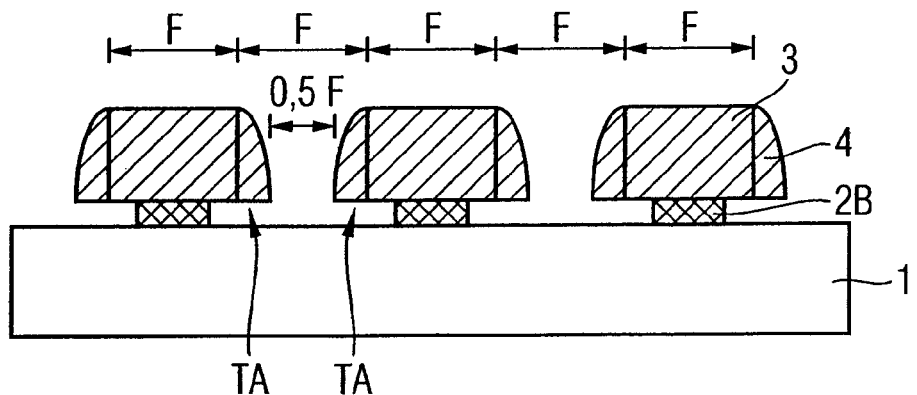

Next, in accordance with FIG. 3, an isotropic etchback of the anisotropically patterned first auxiliary layer structure 2A is carried out to remove subsections TA laterally beneath the first auxiliary layer structure. The isotropic etchback of the anisotropically patterned first auxiliary layer structure 2A is carried out using the patterned second auxiliary layer structure 3 and 4. In this way, an isotropically patterned second auxiliary layer structure 2B, the sublithographic structure width (e.g. a width of F/2) is formed. This isotropic, i.e. non-directional, etching process is once again selective with respect to the carrier layer 1 or Si and to the second auxiliary layer structure or SiN. A number of variants are conceivable for this isotropic etchback.

In another embodiment, a wet-chemical etch diluted with $H_2O$ is used as the etching chemistry. A typical mixing ratio is in this case 10:1 and 10:5. The etchant used is $HNO_3$ (70%/HF) (49%/$CH_3COOH$) (99.9%/$H_2O$). The percentages above indicate percent by weight in water. A volumetric ratio to be used for this etch is, for example, 40/1/2/57. Further details of this isotropic etchback can be found in: Lee et al.: "A Novel Multibridge-Channel MOSFET (MBCFET): Fabrication Technologies and Characteristics", IEEE Transactions on Nanotechnology, Volume 2, No. 4, December 2003, pages 253 to 257.

In a different embodiment, $H_2O_2$ (30%) at a temperature of 90 degrees Celsius is used as the etching chemistry, with the percentage once again representing percent by weight in water. This may be suitable for an SiGe auxiliary layer 2 with a high Ge content of >60%. Further details in this respect are found, for example, in: A. Franke et al.: "Polycrystalline Silicon-Germanium Films for Integrated Microsystems", Journal of Micro-electromechanical Systems, Volume 12, No. 2, April 2003, pages 160 to 171.

In yet another embodiment, the etching chemistry or etchant used is $NH_4OH$ (30%)/$H_2O_2$ (30%)/$H_2O$ with a volumetric ratio of 1/1/5 at a temperature of 75 degrees Celsius. Further details of this are found in: F. Scott Johnson et al.: "Selective Chemical Etching of Polycrystalline SiGe Alloys with Respect to Si and $SiO_2$", J. Electron. Mater., Volume 21, No. 8, pages 805 to 810, 1992. By way of example, with this embodiment, for a Ge content of 40%, an etching selectivity of SiGe:Si=36:1 is achieved, and an etching selectivity for $SiGe:SiO_2$-100:1 is achieved. For a Ge content of approximately 55%, an etching selectivity for SiGe:Si=177:1 and for $SiGe:SiO_2$=487:1 is achieved.

Accordingly, these wet-chemical etching processes can achieve selectivities of greater than 100:1 for SiGe:Si, $Si_3N_4$ and $SiO_2$.

Figure 4:
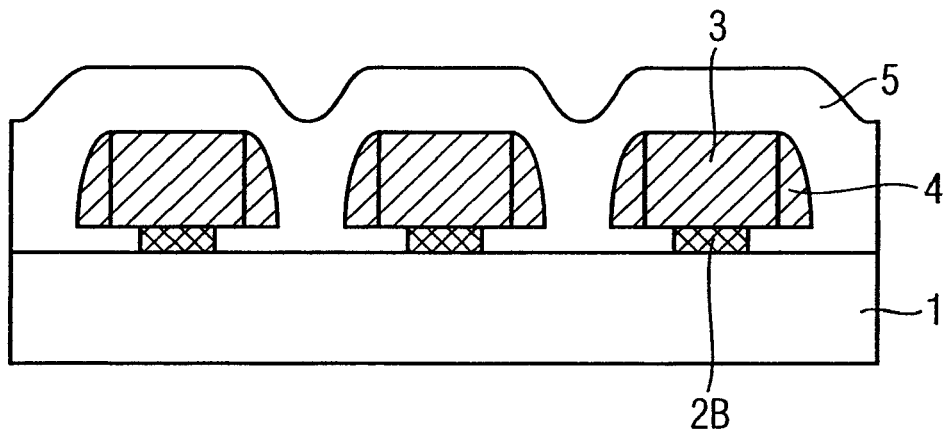

Next, in accordance with FIG. 4, a mask layer 5 is formed over the entire surface of the carrier layer 1 of the isotropically patterned second auxiliary layer structure 2B and of the first auxiliary layer structure 3 and 4. The mask layer 5 is also formed at the subsections TA beneath the first auxiliary layer structure. A conformal deposition may be used, i.e. a deposition of uniform thickness, by means of a CVD (chemical vapor deposition) process or an ALD (atomic layer deposition) process. A layer thickness of the deposition is greater than ½ of the thickness of the first auxiliary layer 2, so that the subsections TA laterally beneath the second auxiliary layer structure are completely filled. The layer thickness may be greater than half the distance between two adjacent second auxiliary layer structures to completely fill the regions between the second auxiliary layer structures. $SiO_2$ may be deposited as material for the mask layer 5, with the result that the subsections TA laterally beneath the second auxiliary layer structure can be filled completely without any voids.

Following this formation of the mask layer 5 over the entire surface, it is possible to carry out an optional planarization of the mask layer 5 (not illustrated). The planarization may be carried out for example by means of a CMP (chemical mechanical polishing) process as far as the surface of the second auxiliary layer structure 3 and 4.

Figure 5:
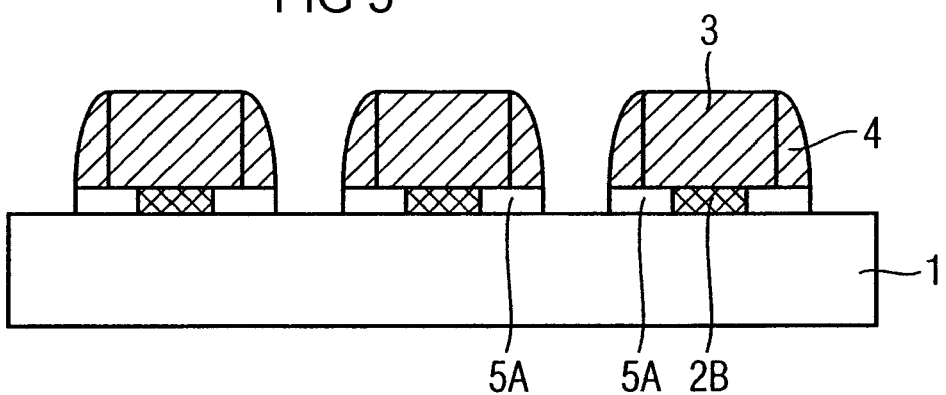

Normally, however, in accordance with FIG. 5, it is then possible, even without this optional planarization, to carry out another anisotropic etchback of the mask layer 5 to form the sublithographic structure 5A, which now has a sublithographic structure width and also a sublithographic distance between the individual structures. By way of example, an RIE (reactive ion etch) dry etching process is used for this anisotropic etchback of the $SiO_2$ mask layer 5.

Figure 6:
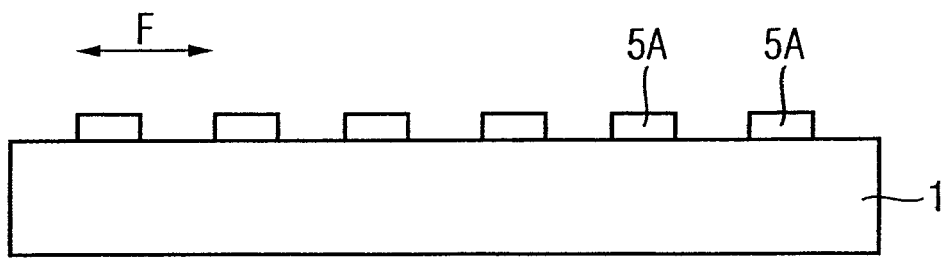

Finally, the first and second auxiliary layer structures 2B, 3 and 4 are removed, a hot phosphoric acid ($H_3PO_4$) at a temperature of 150 degrees Celsius is used to remove the SiN auxiliary layer structure 3 and 4 selectively with respect to the $SiO_2$, with respect to the Si and with respect to the SiGe. The etchants mentioned above in accordance with the additional embodiments can be used once again to remove the remaining SiGe auxiliary layer 2B selectively with respect to $SiO_2$ of the mask layer 5 and with respect to the Si of the carrier layer 1. The result is the sublithographic structures which are illustrated in FIG. 6 and are at a sublithographic distance from one another, with the result that their pitch, i.e. structure width+ structure distance, can be less than 2 F, and can be reduced to 1 F.

The process described above can be used not only to form structure widths and structure distances with a dimension of F/2, but also any desired larger values. In this case, the structure width of the lithographic auxiliary layer structure 3 is lithographically increased. The sublithographic structures can then be transferred to the carrier layer 1 using the prior art processes.

In accordance with a second embodiment, $SiO_2$ is used as the layer to be patterned or as carrier layer 1, and Si is used as mask layer 5. Additional process steps may be identical to the process steps in accordance with the first embodiment, and consequently these process steps are not described again below.

Since a $SiO_2$ layer is used as carrier layer 1, the result is a double hard mask layer. During the conformal deposition of the mask layer 5, amorphous silicon may be deposited by means of a CVD process, with the result that the subsections TA as shown in FIG. 3 and FIG. 4 can be filled particularly successfully without voids. Since Si is used and can be etched more selectively compared to $SiO_2$, the structures can be realized even more precisely or accurately. The result of this second embodiment, in the process step shown in FIG. 6, is a $SiO_2$ carrier layer 1, at the surface of which the sublithographic Si structures 5A are formed.

SiGe has been described above as the first auxiliary layer. In the same way also possible to use C or SiLK or other materials as first auxiliary layers. It is also possible for these materials to be replaced by alternative materials with corresponding etching selectivities. Using any of these materials results in a simple production process, since these are standard materials used in semiconductor technology.

Thus, a sublithographic structure and process for forming such a structure are provided. The sublithographic structure may be, for example, a memory array in which the integration density can be increased at reduced cost.

It is therefore intended that the foregoing detailed description be regarded as illustrative rather than limiting, and that it be understood that it is the following claims, including all equivalents, that are intended to define the spirit and scope of this invention. Nor is anything in the foregoing description intended to disavow scope of the invention as claimed or any equivalents thereof.

The invention claimed is:

1. A layer structure comprising:
a carrier layer;
a first auxiliary layer structure on a portion of the carrier layer;
a second auxiliary layer structure on the first auxiliary layer, the second auxiliary layer structure covering the first auxiliary layer structure entirely,
wherein the second auxiliary layer structure comprises a lithographic auxiliary layer structure and a spacer structure adjacent to the lithographic auxiliary layer structure, the first auxiliary layer structure under the lithographic auxiliary layer structure but not the spacer structure; and
sublithographic structures adjacent to the first auxiliary layer structure and covered by the second auxiliary layer structure, an edge of the sublithographic structures substantially collinear with an edge of the second auxiliary layer structure,
wherein a distance between two adjacent second auxiliary layer structures is set by the spacer structure to half the width of the lithographic auxiliary layer structure, and a width of the sublithographic structures is half the width of the lithographic auxiliary layer structure.

2. The layer structure as claimed in claim 1, wherein the first auxiliary layer structure is SiGe, the second auxiliary layer structure is SiN, the carrier layer and the sublithographic structures are each one of Si and SiO.sub.2, and the carrier layer and sublithographic structures are formed from different materials.

3. The layer structure as claimed in claim 1, wherein a thickness of the first auxiliary layer is less than ¼ of the width of the lithographic auxiliary layer structure.

4. A layer structure comprising:
a carrier layer;
a first auxiliary layer structure on a portion of the carrier layer; a second auxiliary layer structure on the first auxiliary layer, the second auxiliary layer structure covering the first auxiliary layer structure entirely and formed from a different material than the first auxiliary layer structure,
wherein the second auxiliary layer structure comprises a lithographic auxiliary layer structure and a spacer structure adjacent to the lithographic auxiliary layer structure, the first auxiliary layer structure under the lithographic auxiliary layer structure but not the spacer structure; and
sublithographic structures adjacent to the first auxiliary layer structure and covered by the second auxiliary layer structure, an edge of the sublithographic structures substantially collinear with an edge of the second auxiliary layer structure, the sublithographic structures formed from a different material than the first auxiliary layer structure,
wherein a thickness of the first auxiliary layer is less than ¼ of the width of the lithographic auxiliary layer structure.

5. The layer structure as claimed in claim 4, wherein a distance between two adjacent second auxiliary layer structures is set by the spacer structure to half the width of the lithographic auxiliary layer structure, and a width of the sublithographic structures is half the width of the lithographic auxiliary layer structure.

6. The layer structure as claimed in claim 4, wherein a pitch of the sublithographic structures is less than about a minimum feature size.

7. A layer structure comprising:
a carrier layer;
sublithographic structures on the carrier layer;
means for separating the sublithographic structures, wherein a pitch of the sublithographic structures is about a minimum feature size; and
means for masking the separating means such that the separating means is lithographically patternable.

8. The layer structure as claimed in claim 7, wherein a pitch of the sublithographic structures is less than about a minimum feature size.

9. The layer structure as claimed in claim 7, wherein a width of the sublithographic structures is less than about a half of a minimum feature size.

10. The layer structure as claimed in claim 7, wherein a distance between adjacent sublithographic structures is less than about a half of a minimum feature size.

11. The layer structure as claimed in claim 7, wherein the masking means comprises a means for covering the separating means and a means for defining an edge of the sublithographic structures.

12. The layer structure as claimed in claim 1, wherein the first auxiliary layer structure is C, the second auxiliary layer structure is SiN, the carrier layer and the sublithographic structures are each one of Si and $SiO_2$, and the carrier layer and sublithographic structures are formed from different materials.

13. The layer structure as claimed in claim 1, wherein the first auxiliary layer structure is an organic spin-on polymer, the second auxiliary layer structure is SiN, the carrier layer and the sublithographic structures are each one of Si and $SiO_2$, and the carrier layer and sublithographic structures are formed from different materials.

* * * * *